(12) United States Patent
Chang et al.

(10) Patent No.: US 9,401,415 B2
(45) Date of Patent: Jul. 26, 2016

(54) FIN FIELD EFFECT TRANSISTOR (FINFET) DEVICE AND METHOD FOR FORMING THE SAME

(71) Applicant: Taiwan Semiconductor Manufacturing Co., Ltd., Hsin-Chu (TW)

(72) Inventors: Che-Cheng Chang, New Taipei (TW); Chang-Yin Chen, Taipei (TW); Jr-Jung Lin, Hsinchu (TW); Chih-Han Lin, Hsinchu (TW); Yung-Jung Chang, Hsinchu (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 10 days.

(21) Appl. No.: 14/181,320

(22) Filed: Feb. 14, 2014

(65) Prior Publication Data
US 2015/0236132 A1    Aug. 20, 2015

(51) Int. Cl.
  *H01L 29/76* (2006.01)
  *H01L 29/66* (2006.01)
  *H01L 29/78* (2006.01)
  *H01L 29/165* (2006.01)

(52) U.S. Cl.
  CPC .... *H01L 29/66795* (2013.01); *H01L 29/66545* (2013.01); *H01L 29/66553* (2013.01); *H01L 29/785* (2013.01); *H01L 29/7848* (2013.01); *H01L 29/165* (2013.01)

(58) Field of Classification Search
  CPC .................. H01L 29/7848; H01L 29/66795
  USPC .......................................... 257/288
  See application file for complete search history.

(56) References Cited

U.S. PATENT DOCUMENTS

| | | | | |
|---|---|---|---|---|
| 6,969,659 | B1 * | 11/2005 | Anderson | H01L 29/66545 257/346 |
| 8,729,627 | B2 * | 5/2014 | Cheng | H01L 29/66545 257/369 |
| 2012/0235233 | A1 * | 9/2012 | Nowak | H01L 29/66795 257/347 |
| 2013/0082311 | A1 * | 4/2013 | Cheng | H01L 29/7834 257/288 |
| 2013/0307088 | A1 * | 11/2013 | Yang | H01L 29/66545 257/401 |

* cited by examiner

*Primary Examiner* — Tuan Nguyen
(74) *Attorney, Agent, or Firm* — Birch, Stewart, Kolasch & Birch, LLP

(57) ABSTRACT

Embodiments for forming a fin field effect transistor (Fin-FET) device structure are provided. The FinFET device structure includes a fin structure extending above a substrate and a gate dielectric layer formed over the fin structure. The Fin-FET device structure also includes a gate electrode formed on the gate dielectric layer. The FinFET device structure further includes a number of gate spacers formed on sidewalls of the gate electrode. The gate spacers are in direct contact with the fin structure.

13 Claims, 8 Drawing Sheets

FIN FIELD EFFECT TRANSISTOR (FINFET) DEVICE AND METHOD FOR FORMING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, or in other types of packaging, for example.

As the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET). FinFETs are fabricated with a thin vertical "fin" (or fin structure) extending from a substrate. The channel of the FinFET is formed in this vertical fin. A gate is provided over the fin. Advantages of the FinFET may include reducing the short channel effect and higher current flow.

Although existing FinFET devices and methods of fabricating FinFET devices have been generally adequate for their intended purpose, they have not been entirely satisfactory in all aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
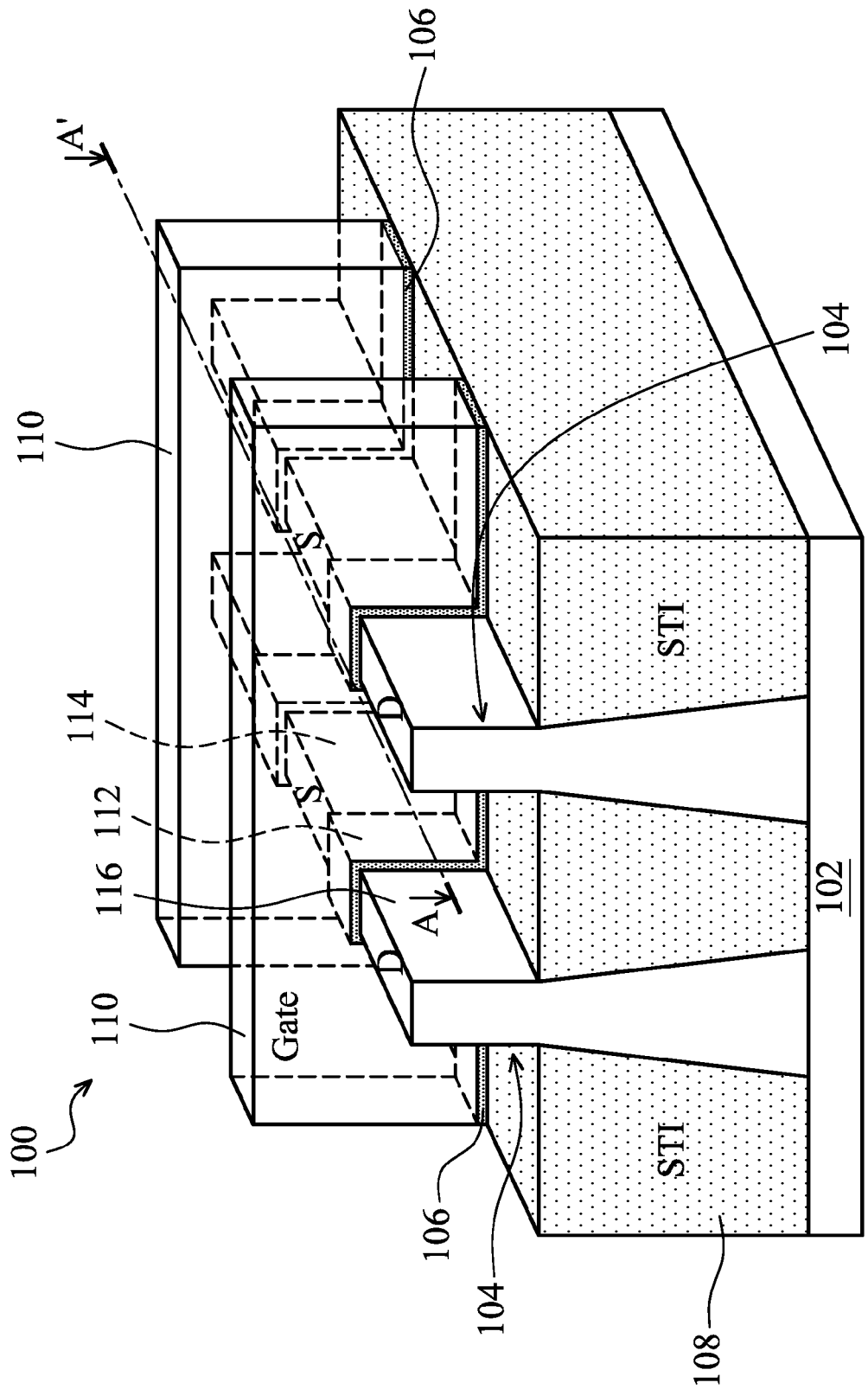
FIG. 1 shows a perspective representation of a fin field effect transistor (FinFET) device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It is understood that additional operations can be provided before, during, and after the method, and some of the operations described can be replaced or eliminated for other embodiments of the method.

Embodiments for forming a fin field effect transistor (FinFET) device structure are provided. FIG. 1 shows a perspective representation of a fin field effect transistor (FinFET) device structure 100, in accordance with some embodiments of the disclosure.

FinFET device structure 100 includes a substrate 102. Substrate 102 may be made of silicon or other semiconductor materials. Alternatively or additionally, substrate 102 may include other elementary semiconductor materials such as germanium. In some embodiments, substrate 102 is made of a compound semiconductor such as silicon carbide, gallium arsenic, indium arsenide, or indium phosphide. In some embodiments, substrate 102 is made of an alloy semiconductor such as silicon germanium, silicon germanium carbide, gallium arsenic phosphide, or gallium indium phosphide. In some embodiments, substrate 102 includes an epitaxial layer. For example, substrate 102 has an epitaxial layer overlying a bulk semiconductor.

FinFET device structure 100 also includes one or more fin structures 104 (e.g., Si fins) that extend from the substrate 102. Fin structures 104 may optionally include germanium. Fin structures 104 may be formed by using suitable processes such as photolithography and etching processes. In some embodiments, fin structures 104 are etched from substrate 102 using dry etch or plasma processes.

Isolation structure 108, such as a shallow trench isolation (STI) structure, is formed to surround fin structures 104. In some embodiments, a lower portion of fin structure 104 is surrounded by isolation structure 108, and an upper portion of fin structure 104 protrudes from isolation structure 108, as shown in FIG. 1. In other words, a portion of fin structure 104 is embedded in isolation structure 108. Isolation structure 108 prevents electrical interference or crosstalk.

FinFET device structure 100 further includes a gate stack structure including a gate electrode 110 and a gate dielectric layer 106. The gate stack structure is formed over a central portion of fin structure 104. In some embodiments, multiple gate stack structures are formed over the fin structure 104. Numerous other layers may also be present in the gate structures, for example, capping layers, interface layers, spacer elements, and/or other suitable features.

Gate dielectric layer 106 may include dielectric materials, such as silicon oxide, silicon nitride, silicon oxynitride, dielectric material(s) with high dielectric constant (high-k), or combinations thereof. Examples of high-k dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, the like, or combinations thereof.

Gate electrode 110 may include polysilicon or metal. Metal includes tantalum nitride (TaN), nickel silicon (NiSi), cobalt silicon (CoSi), molybdenum (Mo), copper (Cu), tungsten (W), alumina (Al), cobalt (Co), zirconium (Zr), platinum (Pt), or other applicable materials. Gate electrode 110 may be formed in a gate last process (or gate replacement process). In some embodiments, the gate stack structure includes additional layers, such as interfacial layers, capping layers, diffusion/barrier layers, or other applicable layers.

Fin structure 104 includes a channel region 112 surrounded or wrapped by gate electrode 110 and gate dielectric layer 106. Fin structure 104 may be doped to provide a suitable channel for an N-type FinFET (NMOS device) or P-type FinFET (PMOS device). Fin structure 104 may be doped using a suitable process, such as an ion implantation process, diffusion process, annealing process, other applicable processes, or combinations thereof. Fin structures 104 includes a source region 114 and a drain region 116 between the channel region 112. FinFET device 100 may be a device included in a microprocessor, memory cell (e.g., Static Random-Access Memory (SRAM)), and/or other integrated circuits.

Figure 2:
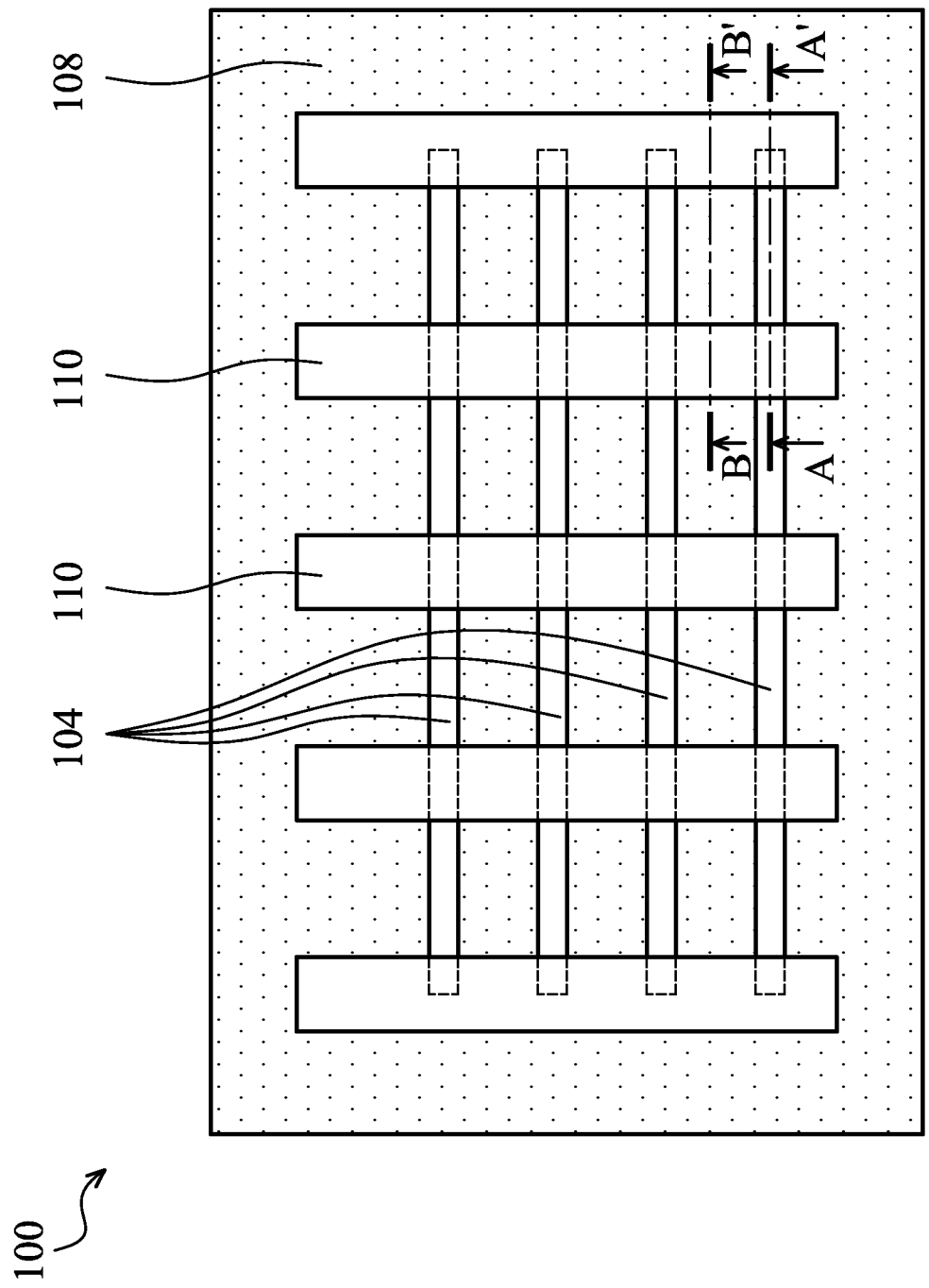
FIG. 2 shows a top-view of a fin field effect transistor (FinFET) device structure, in accordance with some embodiments.

FIG. 2 shows a top-view of a fin field effect transistor (FinFET) device structure 100, in accordance with some embodiments of the disclosure. FinFET device structure 100 includes multiple fin structures 104 and multiple gate electrodes 110. Gate electrodes 110 traverse over fin structure 104. FinFET device structure 100 is surrounded by isolation structure 108.

As shown in FIG. 2, fin structures 104 may be substantially parallel to each other. Gate electrodes 110 may also be parallel to each other and substantially perpendicular to the fin structures 104.

FIGS. 3A-3H show cross-sectional representations of various stages of forming a fin field effect transistor (FinFET) device structure, in accordance with some embodiments of the disclosure. FIGS. 3A-3H are cross-sectional representations taken along AA' line of FIG. 2. FIGS. 3A-3H shows a gate-last process to form high-K/metal gate (HK/MG) structure.

Figure 3A:
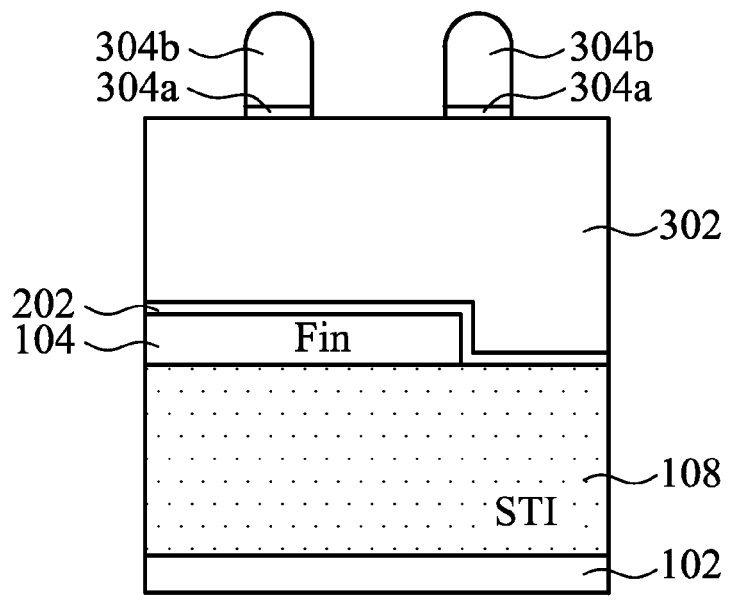
FIGS. 3A-3H show cross-sectional representations of various stages of forming a fin field effect transistor (FinFET) device structure, in accordance with some embodiments of the disclosure.

Referring to FIG. 3A, fin structure 104 is formed over the substrate 102. In some embodiments, the substrate 102 is etched to form fin structure 104 by first depositing and patterning a hard mask layer (not shown) on substrate 102. The hard mask layer forms a pattern covering a portion of substrate 102. Afterwards, substrate 102 is etched to form trenches between the regions covered by the hard mask layer. As a result, fin structure 104 is formed between the trenches.

Afterwards, a dielectric material (e.g., silicon oxide) is deposited into the trenches and covers fin structure 104. The dielectric material is planarized down to the top surfaces of fin structure 104 or the hard mask layer, and then the dielectric material is etched to a level below the top surfaces of fin structure 104. As a result, an upper portion of fin structure 104 protrudes above isolation structure 108, and a lower portion of fin structure 104 is surrounded and covered by isolation structure 108.

Alternatively, in some other embodiments, isolation structure 108 is firstly formed over substrate 102. Trenches between isolation structure 108 are formed to expose substrate 102. A semiconductor material, such as silicon, silicon germanium, or other applicable materials, is then grown in the trenches to form fin structure 104 by using, for example, an epitaxial process. After fin structure 104 is grown to the desired height, isolation structure 108 is etched down to a level below the top surface of fin structure 104. As a result, a portion of fin structure 104 protrudes above isolation structure 108.

As shown in FIG. 3A, an oxide layer 202 and a polysilicon layer 302 are formed on fin structure 104. Afterwards, one or more hard masks 304a, 304b are formed over polysilicon layer 302. Hard mask 304a may be made of silicon oxide, silicon nitride, silicon oxynitride, or other applicable materials. Hard mask 304b may be made of silicon oxide, silicon nitride, silicon oxynitride, or other applicable materials. Hard masks 304a, 304b are formed by a patterning process. The patterning process includes a photolithography process and an etching process. The photolithography processes include photoresist coating (e.g., spin-on coating), soft baking, mask aligning, exposure, post-exposure baking, developing the photoresist, rinsing, drying (e.g., hard baking). The etching process includes a dry etching process or a wet etching process.

Figure 3B:
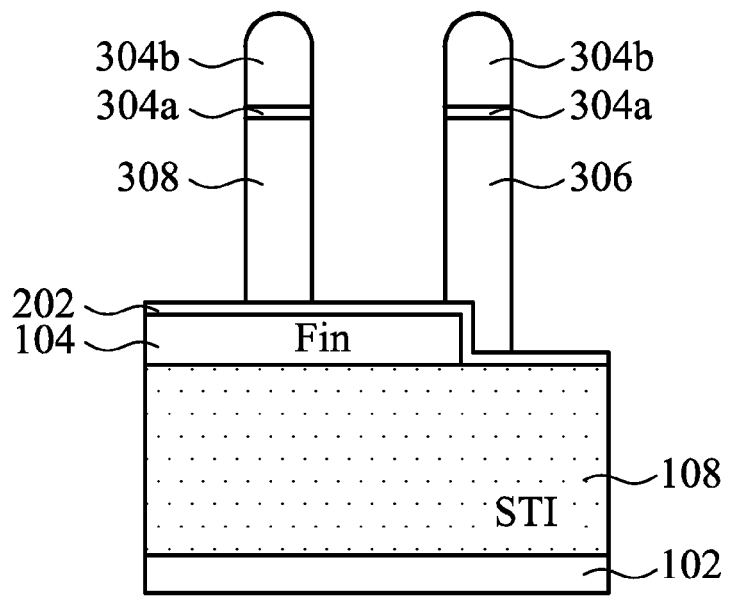

After forming hard masks 304a and 304b, a portion of polysilicon layer 302 are removed by using hard masks 304a and 304b as a mask as shown in FIG. 3B in accordance with some embodiments of the disclosure. As a result, a first polysilicon gate electrode 306 (shown on the right side of FIG. 3B) and a second polysilicon gate electrode 308 (shown on the left side of FIG. 3B) are formed on oxide layer 202. First polysilicon gate electrode 306 is formed over a portion of fin structure 104, oxide layer 202 and a portion of isolation structure 108. Second polysilicon gate electrode 308 is formed on oxide layer 202 and over fin structure 104. In some embodiments, polysilicon layer 302 is removed by an etching process, such as a wet etching process or a dry etching process.

Figure 3C:
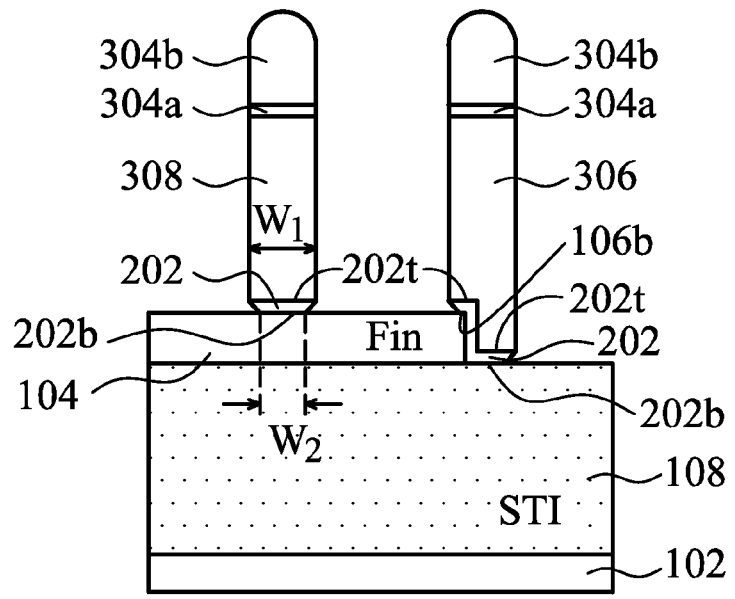

After first polysilicon gate electrode 306 and second polysilicon gate electrode 308 are formed, a portion of oxide layer 202 is removed as shown in FIG. 3C in accordance with some embodiments of the disclosure. In some embodiments, oxide layer 202 is removed by an etching process, such as a wet etching process or a dry etching process.

More specifically, after the etching process, oxide layer 202 has a top surface 106t and a bottom surface 106b, top surface 106t has a top width $W_1$ and bottom surface 106b has a bottom width $W_2$. Top width $W_1$ is larger than bottom width $W_2$. In some embodiments, a ratio ($W_1/W_2$) of top width $W_1$ to bottom width $W_2$ is in a range from about 5 to about 1.

In some embodiments, oxide layer 202 below second polysilicon gate electrode 308 has a trapezoid shape and a sidewall tapered toward fin structure 104. In other words, oxide layer 202 does not have a vertical sidewall. In some other embodiments, because first polysilicon gate electrode 306 is formed over fin structure 104 and isolation structure 108, oxide layer 202 below first polysilicon gate electrode 306 has an L-shape. In addition, oxide layer 202 below first polysilicon gate electrode 306 has a sidewall tapered respectively toward fin structure 104 and isolation structure 108. It should be noted that the sidewalls of oxide layer 202 are not parallel to the sidewalls of polysilicon gate electrode 306 and 308 because a portion of oxide layer 202 is removed.

Figure 3D:
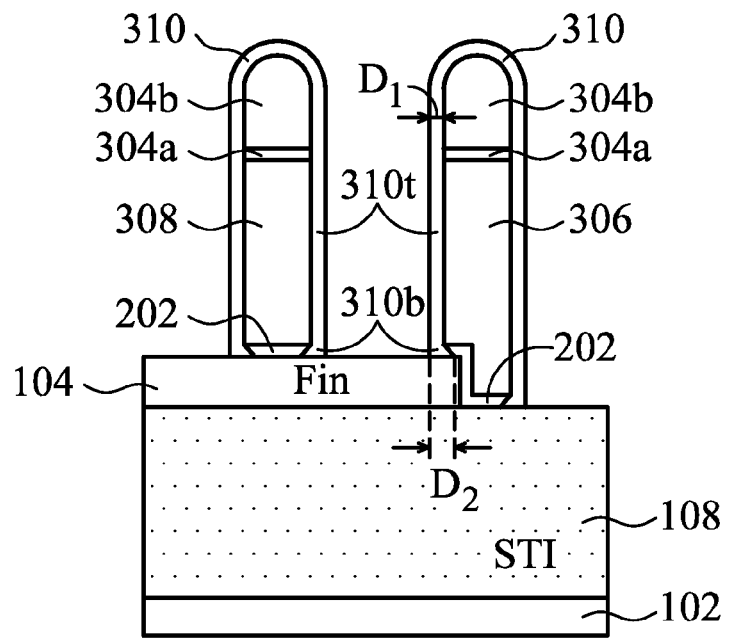

After the portion of oxide layer 202 is removed, gate spacers 310 are formed on the sidewalls of first polysilicon gate electrode 306 and second polysilicon gate electrode 308 as shown in FIG. 3D in accordance with some embodiments of the disclosure. More specifically, at the left side of FIG. 3D, gate spacers 310 are conformally deposited on opposite sidewalls of second polysilicon gate electrode 308 and in direct contact with fin structure 104. At the right side of FIG. 3D, gate spacers 310 are conformally deposited on opposite sidewalls of first polysilicon gate electrode 306 and in direct contact with fin structure 104 and isolation structure 108.

Gate spacers 310 are made of silicon oxide, silicon nitride, silicon oxynitride, and/or dielectric materials. Gate spacers 310 may include one layer or multiple layers. In some embodiments, gate spacers 310 are formed by an atomic layer deposition (ALD) process, chemical vapor deposition (CVD) process or another applicable process.

It should be noted that gate spacers 310 cover the sidewalls of first polysilicon gate electrode 306 and second polysilicon gate electrode 308, and oxide layer 202. Therefore, gate spacers 310 have a top portion 310t adjacent to first polysilicon gate electrode 306 and second polysilicon gate electrode 308, and a bottom portion 310b adjacent to oxide layer 202. Top portion 310t has a top width $D_1$ and bottom portion 310b has a bottom width $D_2$. In some embodiments, top width $D_1$ is smaller than bottom width $D_2$. In some embodiments, a ratio $(D_1/D_2)$ of top width $D_1$ to bottom width $D_2$ is in a range from about 0.1 to about 1.

Figure 3E:
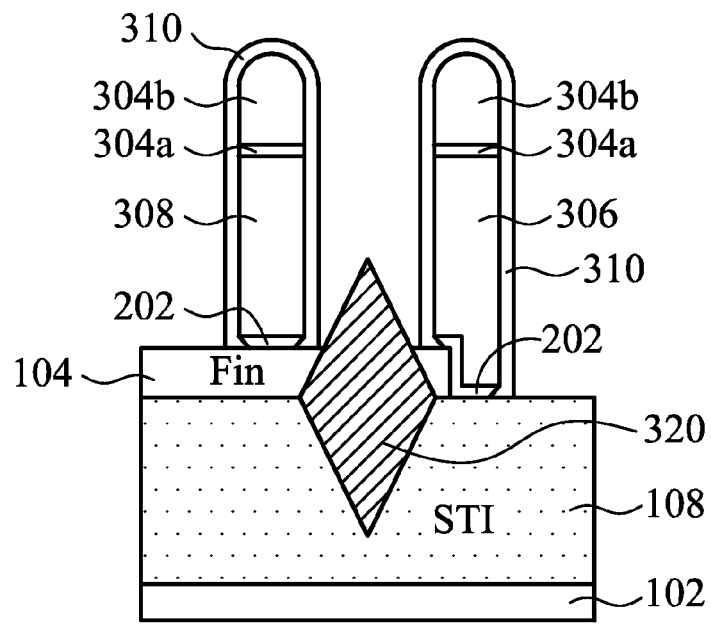

After gate spacers 310 are formed, a source/drain (S/D) stressor 320 is formed adjacent to gate spacers 310 as shown in FIG. 3E in accordance with some embodiments of the disclosure.

In some embodiments, a portion of fin structure 104 and a portion of isolation structure 108 are removed to form a recess (not shown), and afterwards S/D stressor 320 is formed in the recess. In some embodiments, S/D stressor 320 is made of SiGe. In some embodiments, S/D stressor 320 is formed by an epitaxy or epitaxial (epi) process. The epi process may include a selective epitaxial growth (SEG) process, CVD deposition techniques (e.g., vapor-phase epitaxy (VPE) and/or ultra-high vacuum CVD (UHV-CVD)), molecular beam epitaxy, or other suitable epi processes.

Figure 3F:
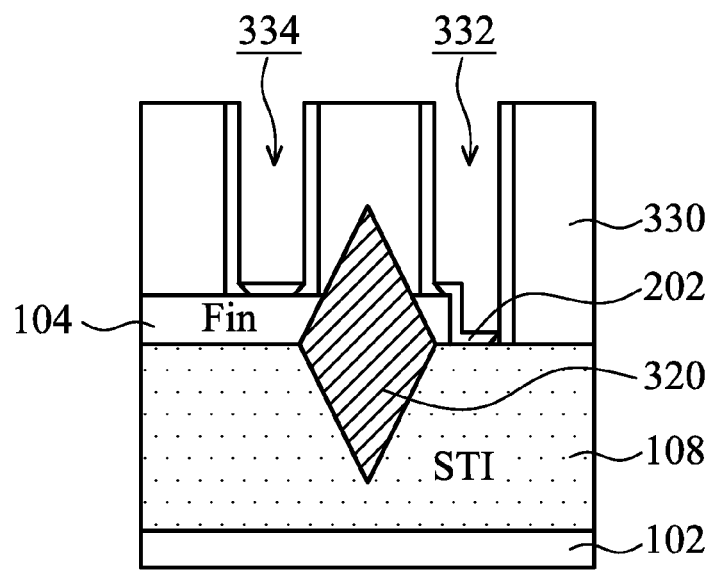

After S/D stressor 320 is formed, hard masks 304a and 304b are removed, and an inter-layer dielectric (ILD) layer 330 is formed on substrate 102 as shown in FIG. 3F in accordance with some embodiments of the disclosure. Afterwards, a planarizing process is performed to expose a top surface of first poly silicon gate electrode 306 and second polysilicon gate electrode 308. In some embodiments, the planarizing process is a chemical mechanical polishing (CMP) process.

ILD layer 330 is formed by any suitable processes, such as a CVD process, HDPCVD process, spin-on process or sputtering process. ILD layer 330 may include any suitable material, such as a silicon oxide, silicon oxynitride, borosilicate glass (BSG), phosphoric silicate glass (PSG), borophosphosilicate glass (BPSG), fluorinated silicate glass (FSG), low-k material, porous dielectric material, and/or combinations thereof. Examples of low-k dielectric materials may include, but are not limited to, fluorinated silica glass (FSG), carbon doped silicon oxide, amorphous fluorinated carbon, parylene, bis-benzocyclobutenes (BCB), or polyimide.

In some embodiments, before forming ILD layer 330, a contact etch stop layer (CESL) (not shown) is optionally formed over substrate 102. The CESL may be silicon nitride, silicon oxide, silicon oxynitride, or other applicable materials.

After ILD layer 330 is formed, first polysilicon gate electrode 306 is removed to form a first trench 332, and second polysilicon gate electrode 308 is removed to form a second trench 334 as shown in FIG. 3F in accordance with some embodiments of the disclosure. In some embodiments, first polysilicon gate electrode 306 and second polysilicon gate electrode 308 are removed by an etching process, such as a wet etching process or a dry etching process.

Figure 3G:
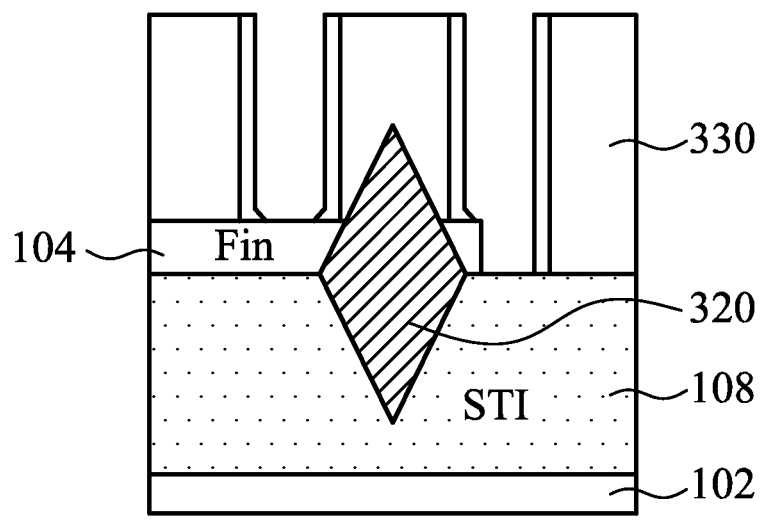

After first polysilicon gate electrode 306 and second polysilicon gate electrode 308 are removed, oxide layer 202 is removed as shown in FIG. 3G in accordance with some embodiments of the disclosure. More specifically, the bottom portion of oxide layer 202 is removed. In some embodiments, oxide layer 202 is removed by an etching process, such as a wet etching process or a dry etching process.

It should be noted that the material of gate spacers 310 is different from that of oxide layer 202 in some embodiments. For example, when gate spacers 310 are made of nitride, an etching process has high selectivity toward oxide and nitride. Therefore, oxide layer 202 is removed easily.

Figure 3H:
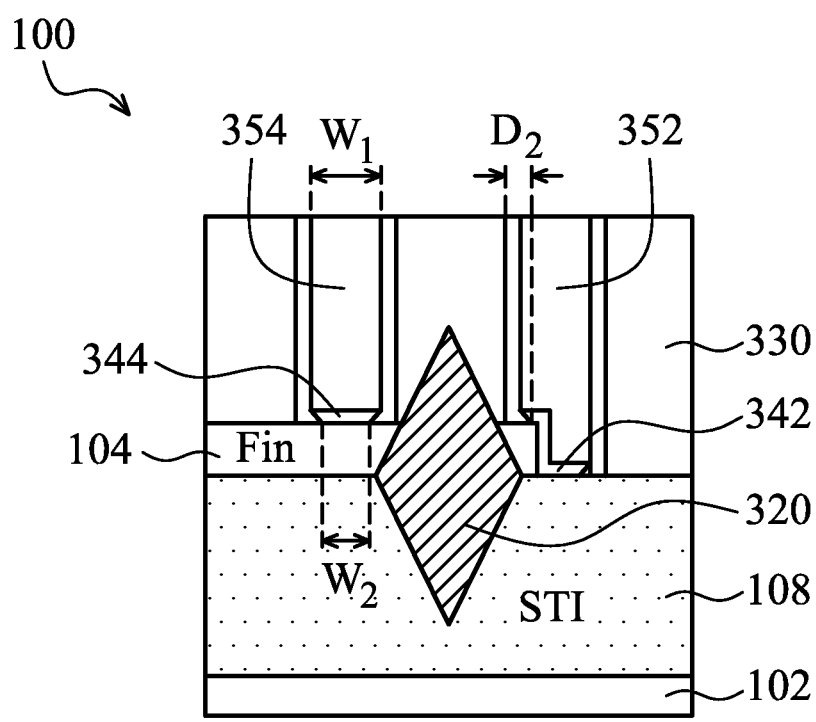

After oxide layer 202 is removed, a first gate dielectric layer 342 and a first metal gate electrode 352 are sequentially formed in first trench 332, and a second gate dielectric layer 344 and a second metal gate electrode 354 are sequentially formed in second trench 334 as shown in FIG. 3H in accordance with some embodiments of the disclosure. Therefore, FinFET device structure 100 is obtained. Afterwards, FinFET device structure 100 may continue with other processes to form other structures or devices.

It should be noted that first gate dielectric layer 342 has a sidewall tapered towards fin structure 104, and second gate dielectric layer 344 has a sidewall tapered towards fin structure 104. In other words, first gate dielectric layer 342 does not have a vertical sidewall, and second gate dielectric layer 344 does not have a vertical sidewall.

First gate dielectric layer 342 and second gate dielectric layer 344 respectively include high dielectric constant (high-k) dielectric materials. Examples of high-k dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, or the like. In some embodiments, first gate dielectric layer 342 and second gate dielectric layer 344 are independently formed by deposition processes, such as a CVD process, HDPCVD process, spin-on process, sputtering process, and/or combinations thereof. In some embodiments, first gate dielectric layer 342 and second gate dielectric layer 344 are simultaneously formed to reduce the fabrication cost.

First metal gate electrode 352 and second metal gate electrode 354 respectively include N-work-function metal or P-work-function metal. The N-work-function metal includes tungsten (W), copper (Cu), titanium (Ti), silver (Ag), aluminum (Al), titanium aluminum alloy (TiAl), titanium alumina nitride (TiAlN), tantalum carbide (TaC), tantalum carbon nitride (TaCN), tantalum silicon nitride (TaSiN), manganese (Mn), or zirconium (Zr). The P-work-function metal includes titanium nitride (TiN), tungsten nitride (WN), tantalum nitride (TaN), or ruthenium (Ru). In some embodiments, first metal gate electrode 352 includes the P-work-function metal, and second metal gate electrode 354 includes the N-work-function metal. Any applicable process, such as a physical vapor deposition (PVD) process, chemical vapor deposition (CVD) process, plating process, electroless plating process, and/or the like, may be performed to form first metal gate electrode 352 and second metal gate electrode 354.

In some other embodiments, gate spacers and polysilicon electrode are formed on the oxide layer (not shown). When the oxide layer is replaced by the gate dielectric layer, a portion of the oxide layer is removed. However, a portion of the oxide layer is protected by the gate spacers. Therefore, while removing the oxide layer, the portion of the oxide layer under the gate spacers remains. The remaining oxide layer is shrunk relative to the gate spacers. As a result, when the gate dielectric layer and the gate electrode are filled, an extrusion path is formed between the gate electrode and the S/D stressor which is adjacent to the gate spacers. The extrusion path may cause an unwanted leakage problem.

It should be noted that a portion of oxide layer 202 is removed (as shown in FIG. 3C) before the gate spacers 310 are formed on the sidewalls of first polysilicon gate 306, second polysilicon gate 308 and oxide layer 202 (as shown in FIG. 3C). In other words, gate spacers 310 have a protruded bottom portion adjacent to gate dielectric layer 342,344. Therefore, a distance $D_2$ between gate dielectric layer 342 and S/D stressor 320 (shown in FIG. 3H) is greater than that in the some other embodiments with the oxide layer under the gate spacers. As a result, the leakage problem is avoided.

FIGS. 4A-4D show cross-sectional representations of various stages of forming a fin field effect transistor (FinFET) device structure 100', in accordance with some embodiments of the disclosure. FIGS. 4A-4D are cross-sectional representations taken along BB' line of FIG. 2. FIGS. 4A-4D show a gate-first process.

Figure 4A:
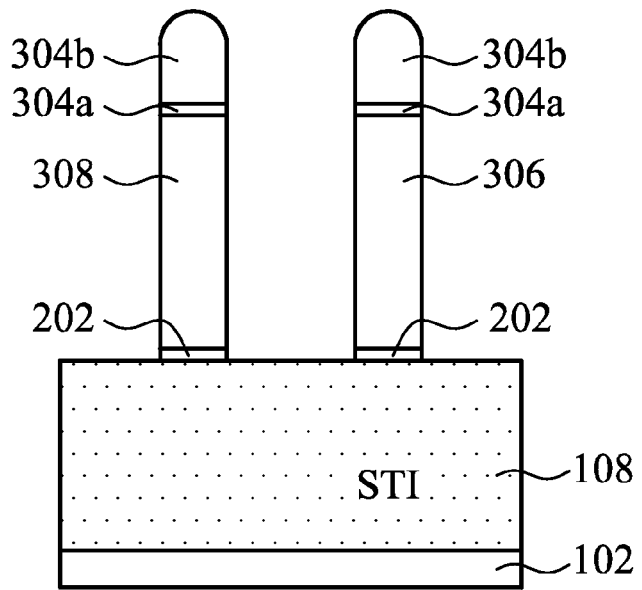
FIGS. 4A-4D show cross-sectional representations of various stages of forming a fin field effect transistor (FinFET) device structure, in accordance with some embodiments of the disclosure.

Referring to FIG. 4A, first polysilicon gate electrode 306 and second polysilicon gate electrode 308 are formed on oxide layer 202. The oxide layer 202 in the embodiments is used as a gate dielectric layer.

One or more hard masks 304a, 304b are formed over first polysilicon gate electrode 306 and second polysilicon gate electrode 308. First polysilicon gate electrode 306 and second polysilicon gate electrode 308 are formed by using hard masks 304a, 304b as a mask. In some embodiments, first polysilicon gate electrode 306 and second polysilicon gate electrode 308 are formed simultaneously.

Figure 4B:
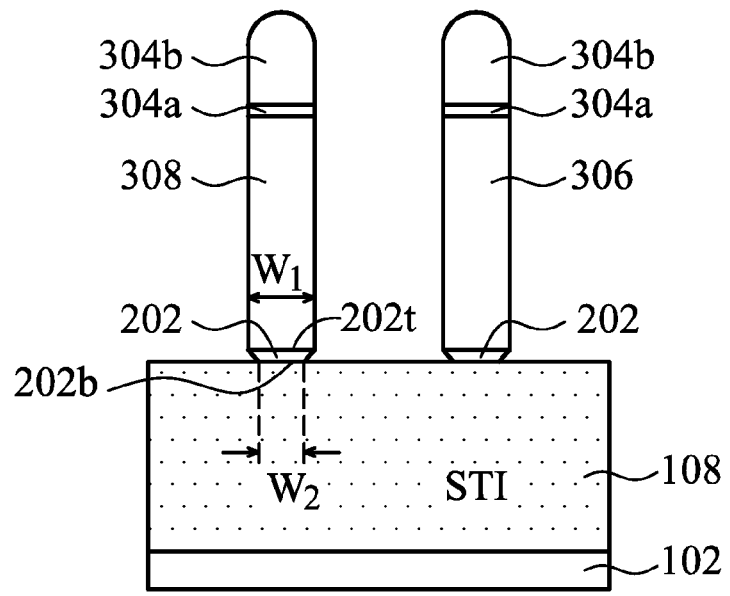

After first polysilicon gate electrode 306 and second polysilicon gate electrode 308 are formed, a portion of oxide layer 202 is removed as shown in FIG. 4B in accordance with some embodiments of the disclosure. In some embodiments, oxide layer 202 is removed by an etching process, such as a wet etching process or a dry etching process.

As a result, oxide layer 202 has a wider top portion and a narrower bottom portion. In other words, oxide layer 202 does not have a vertical sidewall but has a tapered sidewall. In some embodiments, oxide layer 202 has a top surface 106t and a bottom surface 106b, top surface 106t has a top width $W_1$ and bottom surface 106b has a bottom width $W_2$. Top width $W_1$ is greater than bottom width $W_2$.

Figure 4C:
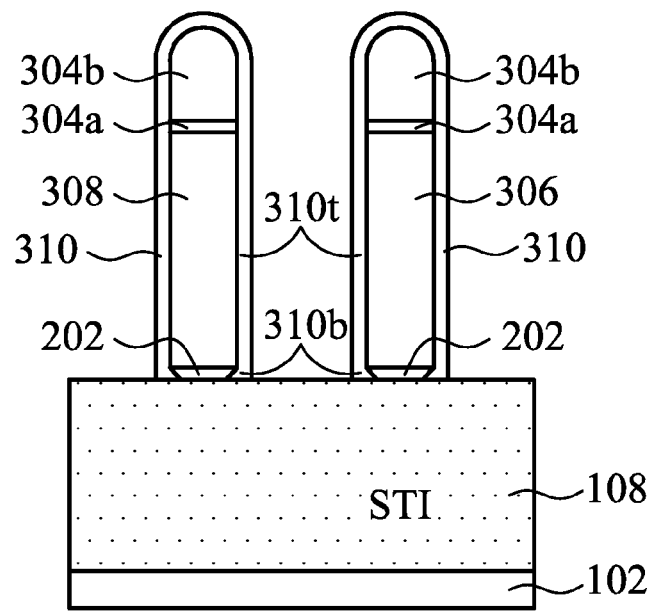

After the portion of oxide layer 202 is removed, gate spacers 310 are formed on the sidewalls of first polysilicon gate electrode 306 and second polysilicon gate electrode 308 as shown in FIG. 4C in accordance with some embodiments of the disclosure.

Figure 4D:
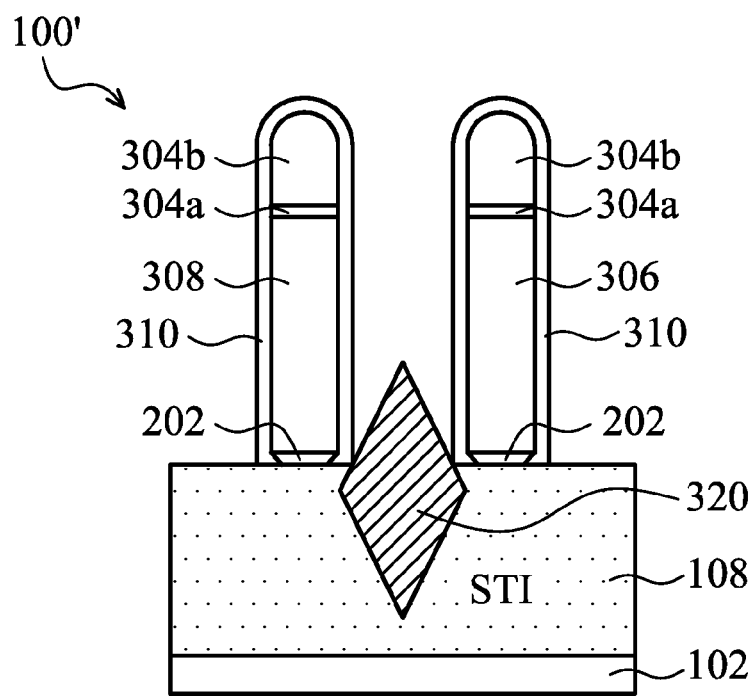

After gate spacers 310 are formed, source/drain (S/D) stressor 320 is formed adjacent to gate spacers 310 as shown in FIG. 4D in accordance with some embodiments of the disclosure.

It should be noted that gate spacers 310 have a top portion 310t adjacent to first polysilicon gate electrode 306 and second polysilicon gate electrode 308 and a bottom portion 310b adjacent to oxide layer 202. Bottom portion 310b is larger than top portion 310t. In other words, gate spacers 310 have a protruded bottom portion adjacent to oxide layer 202. Therefore, FinFET device structure 100' is obtained. Afterwards, FinFET device structure 100' may continue with other processes to form other structures or devices.

It should be noted that because a portion of oxide layer 202 is removed before gate spacers 310 are formed, gate spacers 310 have a wider bottom portion to elongate the distance between S/D stressor 320 and oxide layer 202 (as gate dielectric layer). Therefore, the leakage problem is avoided.

Embodiments for forming fin field effect transistor (FinFET) device structure are provided. The FinFET device structure is formed by a gate-first process or a gate-last process. In some embodiments, an oxide layer is formed between an isolation structure and gate electrode. A bottom portion of the oxide layer is removed before the gate spacers are formed on sidewalls of the gate electrode. Because the bottom portion of the oxide layer is removed, the bottom portion of the gate spacers covering the oxide layer is elongated. As a result, a distance between the gate electrode and an S/D stressor is also be elongated. Therefore, the leakage problem is resolved.

In some embodiments, a fin field effect transistor (FinFET) device structure is provided. The FinFET device structure includes a fin structure extending above a substrate and a gate dielectric layer formed over the fin structure. The FinFET device structure also includes a gate electrode formed on the gate dielectric layer. The FinFET device structure further includes a number of gate spacers formed on sidewalls of the gate electrode. The gate spacers are in direct contact with the fin structure.

In some embodiments, a fin field effect transistor (FinFET) device structure is provided. The FinFET device structure includes a substrate and a fin structure extending above the substrate. The FinFET device structure also includes a gate dielectric layer formed over the fin and a gate electrode formed on the gate dielectric layer. The FinFET device structure further includes a number of gate spacers formed on sidewalls of the gate electrode. The gate spacers have a protruded bottom portion adjacent to the gate dielectric layer. The FinFET device structure also includes a source/drain (S/D) stressor formed adjacent to the gate spacers. The fin structure is formed between the gate dielectric layer and S/D stressor.

In some embodiments, a method for forming a fin field effect transistor (FinFET) device structure is provided. The method for forming the FinFET device structure includes providing a substrate and forming a fin structure extending above the substrate. The method for forming the FinFET device structure also includes forming an oxide layer on the fin and forming a polysilicon gate electrode on the oxide layer. The method for forming the FinFET device structure further includes removing a portion of the oxide layer. The remaining oxide layer has a tapered sidewall. The method for forming the FinFET device structure further includes forming a plurality of gate spacers on sidewalls of the polysilicon gate electrode. The gate spacers are in direct contact with the fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A fin field effect transistor (FinFET) device structure, comprising:
    a fin structure extending above a substrate along a lengthwise direction thereof;
    a gate dielectric layer formed over the fin structure;
    a gate electrode formed on the gate dielectric layer;
    a plurality of gate spacers formed on sidewalls of the gate electrode, wherein the gate spacers are in direct contact with the fin structure; and a source/drain (S/D) stressor formed adjacent to the gate spacers,
wherein the gate dielectric layer has a top surface and a bottom surface, and a bottom width of the bottom surface of the gate dielectric layer is smaller than a top width of the top surface of the gate dielectric layer when seen from a cross sectional view along the lengthwise direction of the fin structure,
wherein the gate dielectric layer has a trapezoid shape or L-shape,
wherein sidewalls of the gate spacers are not parallel to sidewalls of the gate electrode, and
wherein the sidewalls of the gate dielectric layer is sloped to a top surface of the fin structure.

2. The fin field effect transistor (FinFET) device structure as claimed in claim 1, wherein the gate spacers have a top portion adjacent to the gate electrode and a bottom portion adjacent to the gate dielectric layer, and a bottom width of the bottom portion of the gate spacers is larger than a top width of the top portion of the gate spacers.

3. The fin field effect transistor (FinFET) device structure as claimed in claim 2, wherein a ratio of the top width of the top portion of the gate spacers to the bottom width of the bottom portion of the gate spacers is in a range from about 0.1 to about 1.

4. The fin field effect transistor (FinFET) device structure as claimed in claim 1, wherein the gate dielectric layer is a high-k dielectric layer and the gate electrode is a metal gate electrode.

5. The fin field effect transistor (FinFET) device structure as claimed in claim 1, wherein the gate dielectric layer is an oxide layer and the gate electrode is a polysilicon gate electrode.

6. The fin field effect transistor (FinFET) device structure as claimed in claim 1, wherein the bottom width of the bottom surface of the gate dielectric layer is smaller than a width of a bottom surface of the gate electrode.

7. The fin field effect transistor (FinFET) device structure as claimed in claim 1, wherein the S/D stressor extends into the fin structure.

8. The fin field effect transistor (FinFET) device structure as claimed in claim 1, further comprising:
an isolation structure fowled between the substrate and the fin structure, wherein the S/D stressor extends into the isolation structure.

9. A fin field effect transistor (FinFET) device structure, comprising:
a substrate;
a fin structure extending above the substrate along a lengthwise direction thereof;
a gate dielectric layer formed over the fin;
a gate electrode formed on the gate dielectric layer;
a plurality of gate spacers formed on sidewalls of the gate electrode, wherein the gate spacers comprises a protruded bottom portion adjacent to the gate dielectric layer; and
a source/drain (S/D) stressor formed adjacent to the gate spacers, wherein the fin structure is formed between the gate dielectric layer and S/D stressor,
wherein the gate dielectric layer has a top surface and a bottom surface, and a bottom width of the bottom surface of the gate dielectric layer is smaller than a top width of the top surface of the gate dielectric layer when seen from a cross sectional view along the lengthwise direction of the fin structure,
wherein the gate dielectric layer has a trapezoid shape or L-shape,
wherein sidewalls of the gate spacers are not parallel to sidewalls of the gate electrode, and
wherein the sidewalls of the gate dielectric layer is sloped to a top surface of the fin structure.

10. The fin field effect transistor (FinFET) device structure as claimed in claim 9, wherein the gate spacers are in direct contact with the fin structure.

11. The fin field effect transistor (FinFET) device structure as claimed in claim 9, further comprising:
an isolation structure formed between the substrate and the fin, wherein the S/D stressor extends into the isolation structure.

12. The fin field effect transistor (FinFET) device structure as claimed in claim 9, wherein the bottom width of the bottom surface of the gate dielectric layer is smaller than a width of a bottom surface of the gate electrode.

13. The fin field effect transistor (FinFET) device structure as claimed in claim 9, wherein the gate spacers further comprises a top portion adjacent to the gate electrode, and a bottom width of the protruded bottom portion of the gate spacers is larger than a top width of the top portion of the gate spacers.

* * * * *